United States Patent [19]

Smith

[11] Patent Number: 4,532,476

[45] Date of Patent: Jul. 30, 1985

[54] POWER AMPLIFIER CAPABLE OF SIMULTANEOUS OPERATION IN TWO CLASSES

[76] Inventor: Randall C. Smith, 1317 Ross St., Petaluma, Calif. 94952

[21] Appl. No.: 489,915

[22] Filed: Apr. 29, 1983

Related U.S. Application Data

[63] Continuation of Ser. No. 278,717, Jun. 29, 1981.

[51] Int. Cl.³ .............................................. H03F 3/26
[52] U.S. Cl. ..................................... 330/123; 330/51; 330/124 R
[58] Field of Search ................. 330/51, 118, 119, 122, 330/123, 124 R, 124 D, 149, 255, 263, 267, 273, 295; 84/1.25; 381/120, 121

[56] References Cited

U.S. PATENT DOCUMENTS

| | | | |
|---|---|---|---|
| 2,719,190 | 9/1955 | Raisbeck | 179/171 |
| 2,761,019 | 8/1956 | Hall | 179/171 |
| 2,825,766 | 3/1958 | Corderman | 330/119 X |
| 2,994,832 | 8/1961 | James | 330/263 |
| 3,230,467 | 1/1966 | Atherton et al. | |
| 3,631,357 | 12/1971 | Hadlei | |
| 4,087,761 | 5/1978 | Kukumoto et al. | 330/267 |

OTHER PUBLICATIONS

Hust, "Extended Class A Amplifier", *Radio & Television News*, Sep., 1953, pp. 40–42, 146–148.

*Primary Examiner*—James B. Mullins
*Attorney, Agent, or Firm*—Jay M. Cantor

[57] ABSTRACT

An electronic amplifying apparatus intended for sound reproduction and for music instrument amplification wherein two parallel amplifiers, working simultaneously, each in a different class of operation, are fed from a single driver or signal source and whose outputs are combined. In the preferred embodiment at least two pairs of push-pull vacuum tubes are required and they are arranged so that one pair operates Triode Class A while the other pair (or pairs) operates Pentode Class AB (or Class B). The circuit can then be optimized so that the desirable sonic characteristics of Class A Triode operation are imparted into the Class AB (or Class B) Pentodes which actually produce all or nearly all of the power. The output power waveform has the high power and efficiency typical of Class AB (or Class B) Pentode operation but without the detrimental sonic side effects, namely, there is the complete absence of crossover or "notch" distortion, and there is a "soft" gradual onset of clip. Both of these traits are highly desirable and characteristic of the notoriously inefficient Class A Triode operation.

On/Off switching of various pairs of output tubes may further be employed to add flexibility to the system with regard to power availability and sonic performance. Single ended configurations as well as solid state devices or hybrid combinations could be arranged to operate in simultaneous different classes of operation and enjoy its attendent benefits.

21 Claims, 1 Drawing Figure

POWER AMPLIFIER CAPABLE OF SIMULTANEOUS OPERATION IN TWO CLASSES

This is a continuation of Ser. No. 278,717 filed June 29, 1981.

FIELD OF THE INVENTION

High fidelity audio power amplification for sound reproduction and for musical instruments, principally electric instruments, e.g. electric guitar, electric bass, electric piano, synthesizer, and the like.

BACKGROUND OF THE INVENTION

Class A Triode operation is well known to discriminating audiophiles because of its characteristic musicality and "warmth". This warmth of tonality can be ascribed to the avoidance of crossover distortion (because in a push-pull configuration neither device ever approaches cut-off) and to the soft or gradual onset of clip when dynamic levels exceed available undistorted power capability. Unfortunately these virtues of Triode Class A operation carry with them severe penalties of economy, efficiency and low power capability. Operating Class A means that less than half the supply power available can be converted to useful work, and that the devices themselves must be de-rated due to high zero-signal current draw. Connecting the screen grid of a Pentode to its plate, causing it to operate as a Triode, further reduces potential power gain by about half.

These penalties of price and power availability (not to mention heat) have prevented Class A Triode operation from ever gaining popularity in the Music Instrument field even more than in sound reproduction applications. This is particularly unfortunate for a couple of reasons: First, due to the extreme dynamic levels produced by the plucked string (e.g., electric guitar) amplifier, output clip is virtually unavoidable. Second, musicians have done more than learn to live with amplifier distortion, they have incorporated it creatively into their musical expression and have become connoisseurs of different distortion characteristics. In the "heavy metal" idiom as well as the blues and popular milieu, elements of amplifier distortion are so strongly part of the guitar sound as to often comprise about 50 percent of actual sound output. Further, circuits to generate "desirable" distortion effects are well known and in use. These can be used to simulate output circuit distortion independent of output power level. If the history of professional choice were used as a yardstick of "desirable distortion" then clearly the circuit of Smith (U.S. Pat. No. 4,211,893) is a first choice. Here the option of distortion is available via remote switching and can be controlled to enhance solo or "lead" playing. It is interesting to note that Smith's circuit, which generates the distortion in the pre-amplifier section, uses Class A Triodes throughout.

The present invention, however, deals with output power amplification and the inherent distortion characteristics of different circuit configurations. Music is by nature a series of transient and fleeting events. The attack of any given musical note is of particular concern to the musician (as well as the listener) and much of a player's learned technique and expression revolves around the attack of the note. Such is clearly the case with all stringed instruments—including piano—as well as reed, brass and percussion instruments. Further, it can be shown that the manner in which an audio amplifier handles these transient attacks is the single most important factor that distinguishes an outstanding amplifier from one which is merely acceptable in both reproduction and live performance applications. The steady state distortion characteristic of most modern amplifiers is excellent: distortion of any type cannot be heard and competitive measurements have become pointless. Unfortunately though, there is no standard measurement of rating for distortion performance under actual dynamic conditions of use. To produce realistic sound levels in one's living room of a symphony or piano, without some clipping of the transient peaks would require an amplifier of at least 1000 watts and preferably much more.

So the demand for high power is obvious to the home user as well as the musician, yet the occurrence of amplifier distortion—clipping of peaks—remains an unavoidable fact of life to both. Whereas certain types of amplifier circuitry produce high power efficiently, a high sonic penalty is paid: their distortion is noticeable, harsh and disturbing. This is the typical "odd order" harmonic distortion which occurs in Class B type amplifiers and is the product of hard clip and sharp current transfer from push to pull, causing "crossover" "notch" distortion. On the other hand, the Triode Class A circuit produces no crossover distortion and has a "soft" clip. The sound of amplifier distortion at clip and beyond is almost unnoticeable because clip does not occur suddenly, and when it does, it is characterized by the predominance of even order products which are actually harmonious musically (that is consonant, not dissonant) to the fundamental. But the penalty is power. Such a circuit is expensive and inefficient.

The well known amplifier Class AB offers some little improvement. Although the output devices operate Class A at low power, they become more and more Class B when driven harder and a somewhat harsh sounding distortion with an abrupt onset and visible crossover occurs at the crucial time: at clip. The power output and efficiency with Pentodes in an AB arrangement is fairly high however.

BRIEF DESCRIPTION OF THE INVENTION

In my improved amplifier circuit, benefits are derived continuously from both classes because the amplifier actually operates simultaneously in both Triode Class A and Pentode Class AB (or B). The Figure shows four output devices in a push-pull parallel configuration. Electron vacuum tubes are shown but the principles underlying my invention of simultaneous operation in two classes also apply to solid state devices of all types. A pair of Pentode tubes (V5 & V6) are configured as Triodes in a push-pull arrangement. They are biased in such a way that they run fully Class A, that is, they draw substantial plate current at all times throughout the duty cycle and never approach cutoff. At the same time a second pair of output devices may be switched on in parallel to the Class A Triodes for simultaneous different classes of operation when higher output power is called for. This second pair of tubes (V7 & V8) operates as push-pull Pentodes Class AB (or B). This means that the fixed bias, being substantially greater than that for the Triode pair, allows use of much higher Plate voltage while still observing safe levels of dissipation. Further, the fact that these devices are Pentodes, renders the availiable power gain even greater. Signal drive and grid bias for the two pairs are distributed through a divider network adjusted for optimum balance. Such a balance can be achieved so that the net composite operation retains the virtues of both types of device (Triode and Pentode) and of both classes of operation (Class A and Class AB). Since abundant current is always flowing through both halves of the output transformer to supply the Class A Triodes, the smoothness of their transfer characteristic effects and smooths the apparent transfer characteristic through the transformer of the AB pentode pair also. Even at maximum power no crossover distortion is evident. Furthermore, the Triode factor contributes the characteristic of soft, gradual clip which can be made to occur in advance of and to predominate over the clip of the Pentodes at all power levels.

So the circuit enjoys the benefits of high power and efficiency contributed by the Pentodes running Class AB (or even Class B) but has the preferred distortion characteristics—clip and crossover—of Triodes run Class A. Usable tube life is also extended in an amplifier operating simultaneously in different classes because the Class AB Pentodes can be biased very high—into Class B—for cool low current, high power operation, while deterioration of the Class A Triodes results in very little sonic degradation since their power contribution is small.

Part of the present disclosure is the preferred driver amplifier circuitry which maximizes the sonic benefits of simultaneous different classes of operation. A pair of Class A Triode input devices serves the twofold purposes of amplifying the incoming signal and splitting it into two phase inverted components. Excellent linearity and accurate phase inversion are accomplished by using a differentiating amplifier pair whose cathodes are biased through a constant current device. The first triode (V1) operates conventionally with its grid serving as the input element and its plate furnishing the output. The second triode (V2) derives its signal input from its shared cathode configuration with V1. The grid of V2 is grounded (or held slightly above ground to allow the injection of negative feedback) and amplified phase inverted output (with respect to output at the plate of V1) is present at V2's plate. The use of a constant current source in the common cathode circuit greatly helps to insure linearity of V1-V2 over a wide range of operating conditions. A user operable switch means is provided to allow selection of full loop feedback, local feedback only, or no feedback at all. Even though judicious applications of negative feedback are wonderously effective in producing impressive distortion specifications under static testing conditions, many listeners will prefer the greater dynamic realism and open, unrepressed impact of less—or ultimately no—negative feedback. A dual buffer amplifier (V3 & V4) is used to provide sufficient drive amplitude for the amplifier output states. Tubes V3 and V4 are, as usual, operated as Class A Triodes but their common cathodes are carefully biased to maximize one of the effects of simultaneous operation in different classes: soft and gradual clipping. In other words, the plate loading and cathode biasing of V3-V4 is carefully configured so that the onset of clip at V3-V4 is soft and occurs slightly before clip occurs in the amplifier output stages.

A novel configuration with regard to all coupling capacitors is used throughout the driver/buffer circuit. Capacitors with large values are often used in audio preamplifier circuits to allow linear frequency response down to 20 hz or below. Usually the circuit designer (who is aware of the negative consequences of larger capacitor values) must make a compromise based on three trade-offs. If small value capacitors are used, low frequency linearity can not be obtained. If large value capacitors are used, phase shift (or time delay) increases with increasing capacitor value and improved low frequency linearity because each AC signal wave must charge the capacitor against its time constant with the attendent circuit resistance. This problem is remedied in conventional practice by keeping a fairly high impedance (or resistance) on the output side of the capacitor. The undesired (and overlooked) consequence of this solution in a low feedback amplifier is that the zero DC reference state of the capacitor output becomes unstable and gyrates with strong signal fluctuations. This is apparently overlooked because most circuit designers concentrate on the steady state performance of their amplifiers where the DC gyrations on big transients, which settle out after about one second, are usually not discovered or dealt with. In my improved driver/buffer circuit these three problem/trade-offs are virtually elminated by using large capacitors with a fairly low impedance across their inputs and a very high impedance at their outputs.

So then, to summarize, some novelties about my amplifier are:

1. A differential amplifier has a constant current cathode source and acts as phase inverter/first amplifier followed by 2; a dual buffer amplifier whose loading and biasing are arranged to produce clip in a controlled fashion in harmony with 3; a pair of parallel output power amplifiers working simultaneously and in differing classes of operation whose outputs are combined. 4. Negative feedback may be applied selectively: full loop, local or avoided entirely. 5 To provide low frequency linearity while still ensuring faithful AC and DC response in the time domain, large coupling capacitors are arranged throughout in such a fashion that the impedance at their inputs is fairly low while the impedance at their outputs is very high.

BRIEF DESCRIPTION OF THE DRAWING

The drawing shows a schematic diagram of an amplifier circuit in accordance with the present invention.

DETAILED DESCRIPTION OF THE PREFERRED EMBODIMENTS

Figure 1:
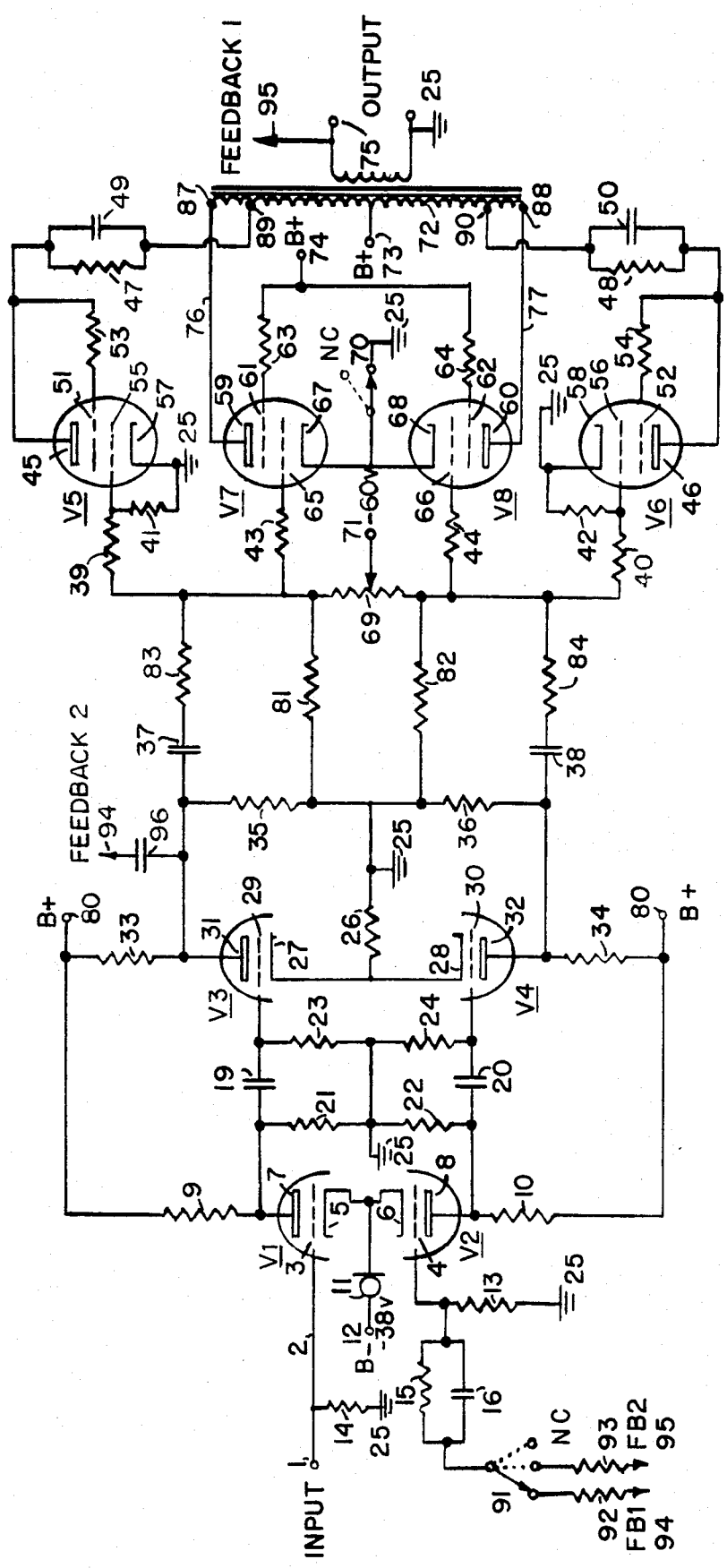

In FIG. 1 the input 1 is connected to the grid 3 of V1 via conductor 2. Grid leak resistor 14 is connected to ground 25. The cathode 5 of V1 is tied directly to the cathode 6 of V2 and both are energized from a negative B— source 12. Use of a constant-current source device 11 in the cathode circuit accomplishes vastly improved linearity of V1 and V2 under widely ranging operating conditions. As V1 amplifies, signal fluctuations which appear on its cathode 5 also appear on the cathode 6 of V2 and are used to drive V2. The grid 4 of V2 is for all intents and purposes grounded although a small resistor 13 may be used to allow the injection of negative feedback to the grid 4 via an RC network 15, 16. A switch means 91 is then provided to select negative feedback originating locally from the output of buffer stage V3 through a blocking capacitor 96 and a series resistor 92. Or as alternatives to suit program material, choice of speaker and listener preference, switch 91 can also be used to select overall negative feedback, which signal would derive from a point 95 at the amplifier output and be buffered through resistor 93. As the third alternate, the switch 91 offers the user the selection of no negative feedback whatever, which listening tests demonstrate is most often preferred. Plates 7, 8 of triodes V1 and V2 are connected to the high voltage B+ supply 80 through high impedance load resistors 9 and 10. Amplified, split phase signals are conducted from the plates 7, 8 of V1 and V2 to the grids 29, 30 of V3 and V4 respectively via coupling capacitors 19 and 20 which are large in value. Grid leak resistors 23, 24 represent a very high impedance while much lower impedance resistors 21, 22 provide DC stability to the large capacitors 19, 20 in the very high impedance grid circuit of V3 and V4 inclusive. Cathodes 27, 28 of V3 and V4 respectively are energized through resistor 26 whose value is selected in conjunction with the values of loading resistors 35, 36 to cause a soft and gradual clip of V3, V4 to occur just prior to the onset of clip in the Class A Triode section of the amplifier output state. The plates 31, 32 of V3 and V4 are energized from the B+ high voltage supply 80 through resistors 33, 34. Output from the plates 31, 32 of V3 and V4 is coupled to the output stages through capacitors 37 and 38, both of which have a large value, and resistors 83 and 84 which are used to present a very high impedance to the output of capacitors 37 and 38. Negative bias for the output stage comprised of V5, V6, V7 and V8 derives from a supply represented at 71. This negative DC bias flows through an output tube balancing network comprised of potentiometer 69 and drain resistors 81 and 82. Bias for the Pentodes V7 and V8 is obtained through low value resistors 43 and 44, and is maintained at a level that provides Class AB (or Class B) operation for these Pentodes. Screen grids 61, 62 of these Pentodes (V7, V8) are fed from a high voltage supply 74 through low value resistors 63 and 64. Pentode plates 59, 60 are impedance matched to the full primary winding 72 of the output transformer with one plate at each of the ends 87, 88. The cathodes 67, 68 of V7 and V8 are selectively energized from ground 25 through a user operable switch means 70. When the switch is open, no current flows, V7 and V8 are effectively in a "standby" mode and the amplifier comprises functionally of the pair of Class A Triodes V5 and V6. With the switch 70 closed, the amplifier circuit comprising V7 and V8 (and any other number of Pentode AB output pairs in parallel) and their inclusive pairs becomes operational and in fact contribute the vast majority of power to the common output 75 as the plates 59 and 60 of V7 and V8 are connected to the output transformer primary 72 through conductors 76 and 77. Pentodes shown as V5 and V6 are made to function as Triodes because their plates 45, 46 are tied to their respective screen grids 51, 52 through low value resistors 53, 54. Cathodes 57, 58 are energized from ground 25. Grid bias on V5 and V6 is reduced to a low value compared to the AB Pentode pair by the divider networks comprising resistors 39 and 41 for V5 and resistors 40 and 42 for V6. Furthermore, the values selected for these divider networks and other resistors in the bias network—as well as in the signal path—are chosen to cause the onset of clip in the Triode Class A pair to occur slightly before the Pentode AB pairs(s) begins to clip. Taps 89, 90 can be provided at lower impedance points on the output transformer primary 72 to properly match the plate loads imposed by the Class A Triode pair. Voltage dropping resistors 47 and 48 can be used to reduce dissipation of the plates 45, 46 of the Class A Triodes V5 and V6 to safe levels while still allowing the maintenance of full DC voltage on the Pentode pair V7, V8. By pass capacitors 49, 50 may be used to restore signal gain lost through the dropping resistors 47, 48.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

I claim:

1. An audio amplifier, primarily for audio power for musical instruments and sound reproduction systems including a plurality of electron discharge devices, each having a plurality of electrodes including an input electrode and an output electrode, at least two pairs of said electron discharge devices being connected in a push-pull parallel configuration, first means for simultaneously applying an electrical signal to each of said input electrodes in common, second means for connecting each of said output electrodes in common to a utilization device, means biasing the electrodes of a first pair of said at least two pairs of electron discharge devices for Class A operation thereof, and means biasing the electrodes of the second pair of said at least two pairs of electron discharge devices for operation in a class other than Class A to cause the onset of clip in said second pair to occur slightly after the onset of clip in said first pair.

2. An audio amplifier as set forth in claim 1 wherein said class other than Class A is one of Class AB and Class B.

3. An audio amplifier according to claim 2 including switch means for selectively rendering at least one electron discharge device pair inoperative.

4. An amplifier according to claim 2 wherein the electron discharge devices are vacuum tubes.

5. An amplifier according to claim 4 wherein the vacuum tubes operating in Class A operate as triodes and the vacuum tubes operating in one of Class AB and Class B are pentodes operating as a triode.

6. An audio amplifier according to claim 1 including switch means for selectively rendering one said electron discharge device pair inoperative.

7. An amplifier according to claim 1 wherein the electron discharge devices are vacuum tubes.

8. An amplifier according to claim 1 wherein at least one pair of said electron discharge device pairs is composed of vacuum tubes.

9. An amplifier as set forth in claim 1 further including a buffer amplifier coupled to said at least two pairs of electron discharge devices, said buffer amplifier being biased to undergo gradual clip just prior to the onset of clip in said pair operating in Class A.

10. An audio amplifier system comprising:
(a) a first amplifier composed of a pair of electron discharge devices in a push-pull configuration, each device having an input electrode operated in Class A;
(b) a second amplifier composed of a pair of electron discharge devices in a push-pull configuration coupled in parallel to said first amplifier and operated simultaneously with said first amplifier in one of Class AB or Class B;
(c) means coupled to said second amplifier to cause the onset of clip therein to occur after the onset of clip in said first amplifier; and (d) a source of power energizing said first and second amplifiers.

11. An audio amplifier system as set forth in claim 10 further including input means coupled to the input of said first and second amplifiers and output means coupled to the output of said first and second amplifiers.

12. An amplifier as set forth in claim 10 further including a buffer amplifier coupled to the inputs of said first and second amplifier, said buffer amplifier being biased to undergo gradual clip just prior to the onset of clip in said first amplifier.

13. An audio amplifier, primarily for audio power for musical instruments and sound reproduction systems including a plurality of electron discharge devices, each having a plurality of electrodes including an input electrode and an output electrode, at least two pairs of said electron discharge devices being connected in a push-pull parallel configuration,
  (a) first means for simultaneously applying an electrical signal to each of said input electrodes in common,
  (b) second means for connecting each of said output electrodes in common to a utilization device,
  (c) means biasing the electrodes of a first pair of said at least two pairs of electron discharge devices for Class A operation thereof,
  (d) means biasing the electrodes of the second pair of said at least two pairs of electron discharge devices for operation in a class other than Class A, and
  (e) buffer amplifier means coupled to said first means biasing to commence clip prior to the commencement of clip in said at least two pairs of electron discharge devices.

14. An amplifier as set forth in claim 13 further including a buffer amplifier coupled to said at least two pairs of electron discharge devices, said buffer amplifier being biased to undergo gradual clip just prior to the onset of clip in said pair operating in Class A.

15. An audio amplifier system comprising:
  (a) a first amplifier composed of a pair of electron discharge devices in a push-pull configuration, each device having an input electrode operated in Class A;
  (b) a second amplifier composed of a pair of electron discharge devices in a push-pull configuration coupled in parallel to said first amplifier and operated simultaneously with said first amplifier in one of Class AB or Class B;
  (c) a source of power energizing said first and second amplifiers;
  (d) a differential amplifier coupled to said input electrodes, said differential amplifier having a constant current source coupled to the electron collecting electrodes thereof; and
  (e) a buffer amplifier coupled to said at least two pairs of electron discharge devices, said buffer amplifier being biased to undergo gradual clip just prior to the onset of clip in said pair operating in Class A.

16. An amplifier, primarily for audio power for musical instruments and sound reproduction systems including at least two pairs of electron discharge devices, each having an input electrode and an output electrode, where the pairs of said electron discharge devices are arranged in push-pull parallel configuration, and further including:
  (a) means for connecting each of said output electrodes to a common utilization device; and
  (b) means for simultaneously distributing differing AC signals and fixed bias voltage ratios to each of said pairs of the push-pull parallel electron discharge devices such that one pair operates Class AB and one other pair operates Class A and continually maintains Class A operation under all operating conditions, wherein said Class A pair operates even when the Class AB pair is driven beyond the linear portion of its characteristic into saturation, said means for distributing including:
  (c) a buffer amplifier coupled to said at least two pairs of electron discharge devices, said buffer amplifier being biased to undergo gradual clip just prior to the onset of clip in said pair operating in Class A.

17. An amplifier according to claim 16 wherein said means for simultaneously distributing causes the Class A pair of push-pull parallel electron discharge devices to maintain Class A operation even while the Class AB pair of electron discharge devices is driven beyond saturation into cut-off.

18. An amplifier according to claim 17 including switch means for selectively rendering at least one electron discharge device pair inoperative.

19. An amplifier according to claim 17 wherein the electron discharge devices are vacuum tubes.

20. An amplifier according to claim 16 including switch means for selectively rendering at least one electron discharge device pair inoperative.

21. An amplifier according to claim 16 wherein the electron discharge devices are vacuum tubes.

* * * * *